United States Patent [19]

Rodriguez et al.

[11] Patent Number: 4,751,172

[45] Date of Patent: Jun. 14, 1988

[54] PROCESS FOR FORMING METAL IMAGES

[75] Inventors: Stephen S. Rodriguez, Pocasset; Robert E. Hawkins, Northboro, both of Mass.

[73] Assignee: Shipley Company Inc., Newton, Mass.

[21] Appl. No.: 891,609

[22] Filed: Aug. 1, 1986

[51] Int. Cl.$^4$ .............................................. G03C 5/00
[52] U.S. Cl. .................................... 430/314; 430/318; 430/319; 430/323; 430/324; 430/329; 430/312; 204/180.2; 204/181.1
[58] Field of Search ..................... 430/270, 12, 18, 32, 430/277, 311, 312, 313, 314, 319, 328, 325, 329, 394, 323, 324; 204/180.2, 180.4, 181.1

[56] References Cited

U.S. PATENT DOCUMENTS

| | | | |
|---|---|---|---|
| 3,892,646 | 7/1975 | Lazzarini et al. | 204/181.6 |
| 4,170,819 | 10/1979 | Peter et al. | 29/625 |
| 4,592,816 | 6/1986 | Emmons et al. | 204/180.6 |

FOREIGN PATENT DOCUMENTS 0155231  9/1985  European Pat. Off. .

Primary Examiner—John E. Kittle
Assistant Examiner—José G. Dees
Attorney, Agent, or Firm—Robert L. Goldberg

[57] ABSTRACT

A method for coating a conductive surface with an organic coating where one discrete area of the organic coating is coated onto the surface in an image pattern by conventional means and another discrete area of the organic coating is electrophoretically deposited onto the surface. The process is useful for diverse applications including the fabrication of printed circuit boards.

14 Claims, 1 Drawing Sheet

PROCESS FOR FORMING METAL IMAGES

BACKGROUND OF THE INVENTION

1. Introduction

This invention relates to alteration of a conductive surface utilizing a process involving electrophoretic deposition of an organic coating in an image pattern. More particularly, the invention relates to a process for forming an organic coating on a conductive substrate having discrete areas defining an image where the discrete areas have chemical compositions, resistance to attack by aggressive chemicals and solubilities in solvent or strippers differing from each other and where at least one of said discrete areas of the organic coating is applied to the conductive surface by electrophoretic deposition. In one embodiment of the invention, the organic coating is a single photoresist layer comprising distinct photoresist formulations, each in an image pattern where each image pattern is the negative image of the other and where each is developable or removable in a developer or stripper that is not a developer or stripper for the other. In another embodiment of the invention, the organic coating is a single layer comprising a photoresist and a non-imageable resist, each in a negative image pattern of the other, where the photoresist and the non-imageable resist areas are developable or removable in a developer or stripper that is not a developer or stripper for the other. A preferred embodiment of the invention is directed to the formation of printed circuit boards utilizing photoresists and electrophoretically deposited organic coatings as a single coating layer where the electrophoretic coating is substituted for an inorganic coating in the processing sequence.

2. Description of the Prior Art

The invention described below includes a process especially useful for the formation of printed circuit boards though the process is not limited to circuit board formation. Accordingly, portions of the description which follows emphasize circuit board fabrication though other uses for the process will be apparent to those skilled in the art.

The subtractive method for the manufacture of a double sided, through hole printed circuit board begins with a copper clad dielectric circuit board substrate such as a copper clad epoxy substrate. In one process, through holes are drilled through the substrate and the walls of the holes are metalized by a process involving catalysis and electroless metal deposition. Methods for metalizing through holes are disclosed in U.S. Pat. Nos. 3,011,920 and 4,585,502 incorporated herein by reference.

Following metallization of the through holes, a circuit image is formed by coating the copper cladding with an organic coating material in an image pattern. The organic coating material may be either a screen resist or a photoresist in an image pattern. Using a screen resist, the image is formed during the coating process such as by silk screening. Using the photoresist, the coating is applied as a single unitary coating by dipping, spin coating, as a dry film, by electrophoretic deposition, etc. The photoresist film is then exposed to activating radiation in a desired circuit image and the exposed coating is developed with a liquid developer capable of differentiating light exposed areas from areas that have not been light exposed and dissolving one or the other dependent upon whether the photoresist is a positive or negative photoresist. Examples of suitable photoresist materials are disclosed in U.S. Pat. Nos. 4,093,461; 4,148,654; and 4,339,516 incorporated herein by reference.

Development of a photoresist bares the underlying copper cladding on the surface of the substrate. The cladding together with the metalized through holes may then be reinforced by electroplating copper thereon. The photoresist used in the process must be able to withstand attack by the electroplating bath. This copper comprises the circuit pattern of the finished board. The remaining copper must then be removed to form the circuit. This may be accomplished by electroplating a dissimilar metal over the copper such as solder, immersion tin, gold or a tin nickel alloy. The organic coating in an image pattern permits deposition of the etch resistant metal in an image pattern. The organic coating is then removed with a solvent to bare the remainder of the copper cladding. Such solvents are known in the art and may include aqueous formulations dependent upon the photoresist used to define the image pattern. The copper cladding is dissolved by contact with a etchant which dissolves exposed copper but does not aggressively attack the etch resistant metal and therefore does not attack the copper protected by the etch resistant metal. Consequently, the etching step permanently alters the surface of the substrate—i.e., by removing exposed copper by etching.

A final step in the fabrication of a board may involve stripping (dissolving) the etch resistant metal from the board leaving the desired circuit pattern. A processing sequence such as that discussed above is set forth in Coombs, *Printed Circuit Handbook*, McGraw Hill Book Company, New York, 1979, chapters 6 and 7, incorporated herein by reference.

The subtractive process for making photoresists is the process most often used in the industry. However, the process is not without drawbacks. For example, to permanently alter the copper cladding—i.e., to form the circuit by etching, it is necessary to use an etch resistant metal such as solder. The application of an etch resistant metal typically involves the use of electroplating equipment including a treatment tank equipped with electroplating electrodes. Further, the electroplating process is time consuming. In addition, the need to remove etch resistant metals involves etchants to dissolve such metals. It is known that the waste treatment of etchant solutions loaded with dissolved metals is difficult and costly.

SUMMARY OF THE INVENTION

The subject invention is directed to a process using electrophoretic deposition of an organic coating in an image pattern. More particularly, the invention is directed to a process where a conductive substrate is altered by use of a single organic coating having areas of dissimilar composition, resistance to aggressive chemical compositions and solubility in solvents or strippers and where at least one of said discrete areas has been applied by electrophoretic deposition. Dissimilar solubility in solvents or strippers permits formation of a desired relief image over the substrate through selection of an appropriate solvent. Dissimilar composition and resistance to aggressive chemicals permits alteration of the underlying substrate using treatment procedures and/or chemicals that might adversely effect one of the organic coating materials, but not the other.

The invention is based in part upon the ability to deposit organic coatings in discrete patterns using electrophoretic deposition procedures. More particularly, the process of the invention is based in part upon the electrophoretic deposition of an organic coating over a conductive surface in an image pattern defined by another organic coating applied in convention manner to form a single organic layer having areas of differing composition.

In simplified form, one embodiment of the process of the invention involves the following sequence of steps:
1. apply a first organic coating over a conductive surface in a desired relief image pattern;
2. electrophoretically deposit a second organic coating over exposed areas of the conductive surface not coated with the first organic coating, the first and second organic coating being soluble in different solvents;
3. remove the first organic coating in a solvent that is not a solvent for the second organic coating thereby exposing the underlying conductive coating in an image pattern; and
4. permanently alter the exposed underlying conductive coating.

The above process may include additional process steps at any point in the process. Representative more complete processes will be described below. In addition, either the first, second or both organic coatings may be light sensitive photoresists or screen resists dependent upon the use to which the process is to be put. The conductive surface is most often metal. The permanent alteration of the surface may be by etching to dissolve the surface such as in a method for the formation of a printed circuit by a subtractive process or by deposition onto the surface such as by metal plating. Finally, the single layer of the organic coating having discrete areas of differing composition may be on a single plane or may be a continuous coating over several planes as will be described in greater detail below.

The process of the invention is useful for such diverse operations as chemical milling, the manufacture of printed circuit boards, the formation of printing plates, manifold plating, sputtering processes, etc.

DESCRIPTION OF THE PREFERRED EMBODIMENTS

Figure 1:
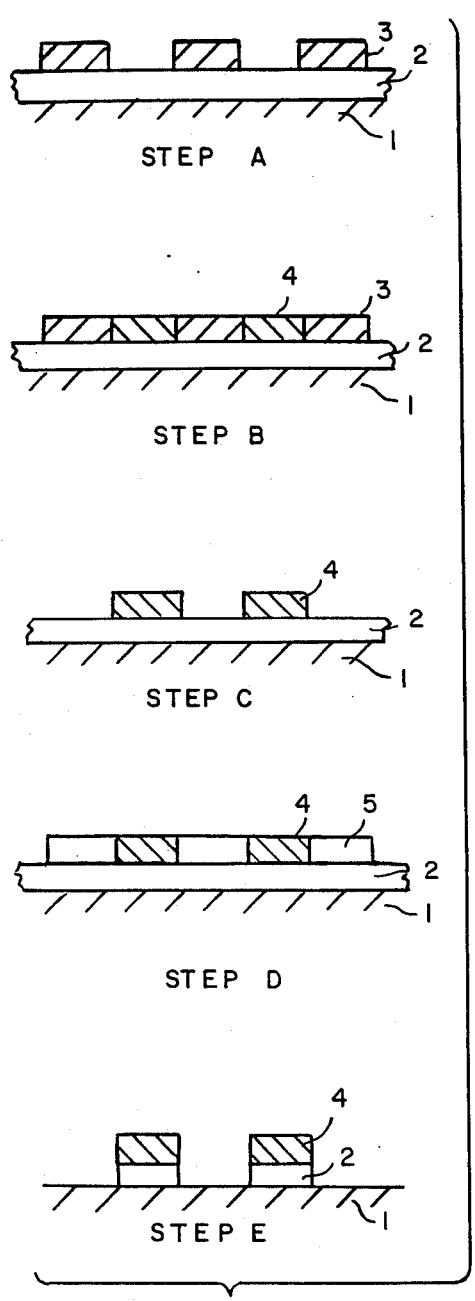
FIG. 1 represents an article of manufacture as it would appear at different stages of its manufacture in accordance with one process of this invention.

This invention pertains to processes using electrophoretic deposition and more particularly, to processes using electrophoretic deposition that involve the permanent modification or alteration of a conductive surface employing electrophoretically applied organic coatings.

The term conductive surface as used herein means any surface possessing sufficient conductivity to permit electrophoretic deposition of an organic coating composition. Metal surfaces are preferred. Typical metals contemplated include, without limitation, copper, nickel, aluminum, titanium, etc. For the manufacture of printed circuits, the conductive surface would typically comprise copper cladding over a dielectric printed circuit board base material such as a fiber reinforced epoxy resin or a phenolic resin.

Permanent alteration or modification of the conductive surface, as contemplated herein, means treatment in a manner that permanently alters the surface such as by etching with an etchant to remove metal, chemical treating such as by oxidizing to form a chemical coating on the surface, plating from a metal plating solution, etc. A process involving etching would find utility in chemical milling and in the fabrication of printed circuit boards. A process involving chemical treatment would find application in metal plating by displacement and in the formation of various coatings such as conversion and conformal coatings. A process involving electroless or electrolytic plating would find utility in the manufacture of printed circuit boards by additive means.

Electrophoretic deposition involves a process of electrophoresis which is the motion of charged particles through a liquid medium under the influence of an applied electrical field. The deposition is conducted in a cell with the conductive surface to be coated serving as one electrode. Charged polymer in a liquid medium is electrophoretically deposited on an oppositely charged electrode. Deposition of a positively charged polymer on a cathode is referred to as cataphoresis while deposition of a negatively charged polymer on a positively charged anode is known as anaphoresis.

Coating metal surfaces with light insensitive organic materials by electrophoresis is a process known in the art and is primarily used to paint metal surfaces such as automobiles. However, the process has also been used to prepare electrical components such as resistors and capacitors. One such process is disclosed in U.S. Pat. No. 3,303,078 directed to anaphoresis of a non photoactive acrylic interpolymer to prepare thermally curable insulating coatings for electrical devices. U.S. Pat. No. 3,446,723 is similar, but directed to cataphoresis. Other publications disclosing the use of electrophoresis to deposit non photoactive coatings include U.S. Pat. Nos. 3,925,181; 3,975,251; 3,200,057; 4,238,385; and 4,338,235 and "Polymer Compositions for Cationic Electrodepositable Coatings," P. E. Kondomenos and J. D. Nordstrom, *Journal of Coatings Technology,* Volume 54 No. 686, March 1982, pp. 33–41.

Electrophoretic deposition of photoresist coatings is also known. U.S. Pat. No. 3,738,835 describes the use of anaphoresis to deposit a photosensitive composition of a polychloroprene polymer and a photosensitizer such as 4,4'- bis - (dimethylamino) - benzophenone in a mixed organic solvent. Upon exposure of the photosensitive composition to radiation, the unsaturated polymer crosslinks and the unexposed film is developed with an organic solvent U.S Pat. Nos. 3,954,587; 4,029,561; 4,035,273; 4,035,274; 4,039,414; 4,066,523; 4,070,258; and 4,166,017 also disclose coatings that are applied electrophoretically and exposed to activating radiation.

Japanese patent Disclosure No. 55 (1980)-14849, entitled "Method For Preparing Printed Wiring Boards," discloses a process for electrophoretic deposition of a light sensitive organic coating in the manufacture of circuit boards. The process comprises forming plated through holes in a copper clad circuit board base material, electrophoretically depositing an organic resist onto the surface of the printed circuit board base material, exposing and developing the electrophoretically deposited film to form an image pattern, etching exposed copper, and removing the electrophoretically deposited film. In effect, the patent teaches that electrophoretically deposited photoresist is used in the same way as photoresist applied by conventional means in the manufacture of printed circuit boards.

The first step in the process of the invention, following preparation of the conductive surface such as by cleaning and etching in accordance with art recognized procedures involves application of a first organic coating material to the conductive surface in a desired image pattern. This step is illustrated in FIG. 1 of the drawings, Step A, where there is shown a substrate material 1, such as a non-conducting plastic, e.g., an epoxy circuit board base material, clad with copper cladding 2 and coated in an image pattern with organic coating material 3. The formation of the organic coating in the image pattern can be accomplished in numerous ways known to the art such as by application of a screen resist or by formation of a light sensitive photoresist film over the conductive surface.

Screen resists are organic coating compositions that are applied to a surface through a stencil or screen to form a wet coating in an image pattern. The ink is hardened by baking, U.V. exposure, etc. Such resists typically comprise a polymer or pre-polymer binder plus initiators to cause hardening of the ink. Urethanes, acrylates and epoxies are typical binders for screen resists. Screen resists are well known in the art and disclosed in numerous publications including U.S. Pat. Nos. 4,056,453; 4,104,144; 4,113,593; 4,126,527 and 4,270,985, all incorporated herein by reference. Such materials are low in cost and easy to use, but are incapable of providing images of fine line resolution.

When an image having fine line resolution is required, it is preferred to substitute a photoresist for the screen resist to form the relief image. Photoresists are known and applied to a surface in a variety of ways such as by coating from a liquid solution, application of the resist as a dry film and by electrophoresis as described above.

Liquid photoresists coating compositions are used to form liquid coatings from organic solutions which, when dried and exposed to light of the proper wavelength, are chemically changed in their solubility to certain solvents or developers. Two types are available: negative-acting and positive-acting. The negative acting resist is initially a mixture which is soluble in its developer but after light exposure, becomes polymerized and insoluble in developer. Exposure is made through a film pattern or master. The unexposed resist is selectively dissolved, softened or washed away leaving the desired resist pattern on the substrate.

Positive-acting resists work in the opposite fashion: exposure to light causes the formulation to become soluble in the developer. The resist image is frequently dyed to make it visible for inspection and retouching. The resist pattern that remains after development (and post baking in some cases) is insoluble. Formulations for such photoresists are well known and they are typically formulated from materials such as vinyl cinnamate copolymers, as disclosed in U.S. Pat. Nos. 2,737,297; 2,739,892 and 2,801,233; benzal acetophenones as disclosed in U.S. Pat. Nos. 2,716,097 and 2,716,102; quaternary salts such as disclosed in U.S. Pat. No. 2,908,667; azide polymers such as disclosed in U.S. Pat. No. 2,948,610; and naphthoquinone diazide esters and amides as disclosed in U.S. Pat. Nos. 3,634,082; 4,148,654 and 4,439,516, all incorporated herein by reference.

In addition to the liquid resist compositions, the photoresists can also be applied in the form of a dry film as taught in U.S. Pat. Nos. 4,378,264 and 4,530,896 incorporated herein by reference. Such dry film resists typically comprise photohardenable layers prepared from polymer binders such as polyacrylates and polyacrylate esters; monomeric components such as such as ethylenically unsaturated materials including butyl acrylate, 1,5-pentanediol diacrylate; initiators such as polynuclear quinones having two intracyclic carbon atoms in a conjugated carbocyclic ring system such as 9,10-anthraquinone; and inhibitors.

As described above, and as will be further described below, the photoresist can be applied by electrophoretic deposition over a conductive surface. Following electrophoretic deposition of the resist coating, it is imaged and developed in conventional manner.

In accordance with a preferred embodiment of the invention, the coating composition used to form the first relief image is a coating composition capable of being stripped from the surface of the substrate in a mild aqueous solution. A suitable negative acting resist formulation is set forth in the aforesaid U.S Pat. No. 4,378,264, Example 1, and preferably, this resist is applied as a dry film. A suitable positive acting photoresist is a liquid coating composition comprising a novolak type phenolic or cresol resin and a naphthoquinone diazide sulfonic acid ester in an organic solution. Compositions of this nature are disclosed in the aforesaid U.S. Pat. No. 3,634,082. A composition exemplified by Example 2 of said patent constitutes a preferred embodiment of a positive resist for use in the process of the invention.

The next step in the process may comprise treatment of the conductive surface bared by formation of the relief image in the first organic coating. Such a step may involve metal plating such as a step of copper electroplating in printed circuit manufacture. However, for purposes of illustration, such a step has been omitted from the process description to show the inventive process in its simplest embodiment. Additional process steps that may be applied at this point in the process will be discussed below.

The next step in the process comprises electrophoretic deposition of a second organic coating over the exposed surface of the cladding metal bared by development and consequently not coated with the first organic layer. Following electrophoretic deposition, the article formed would be as shown in Step B of FIG. 1 where the second coating 4 resides in the spaces between organic coating 3 which defines an image pattern over copper cladding 2. It should be noted that the first and second organic coatings are negative images of each other, and in this embodiment of the invention, comprise a planar layer. The requirements of the second organic coating 4 are that it be of a material that is:
1. capable of electrophoretic deposition;
2. essentially insoluble in stripper or solvent for the first organic coating; and
3. resistant to attack by subsequent processing materials used to alter the surface of the substrate.

In addition to the above, for some processes as will be described in greater detail below, it is desirable that the second coating be a light sensitive photoresist formulation such that it may be exposed and developed to yield a relief image.

As above, the second organic coating is applied by electrophoretic deposition. By this process, the organic coating material will deposit only on the conductive surface, not on the non-conductive first organic coating. Since the first organic coating is in an image pattern, electrophoretic deposition of the second organic coating is also in an image pattern where the image pattern is a negative of the image in the first organic coating.

In the procedure described herein, electrophoretic deposition of the organic coating is possible because conductive layer 2 as shown FIG. 1 is a continuous coating providing conductivity to all areas where deposition is desired. Since the entire surface of the board is conductive, electrophoretic deposition is possible over all conductive surfaces. Therefore, the second organic coating will deposit over the bare copper, but not over those portions of the surface protected by the first organic coating which coating acts as an insulating layer preventing deposition. The result is two organic coating materials in an image pattern over a surface where one organic coating is in a negative image pattern of the other organic coating.

As stated above, the second organic coating may be a light sensitive organic coating or a light insensitive coating dependent upon the use to which the coating is put. This will be explained in greater detail below. It should be a material that will not be attacked by a solvent or stripper for the first organic coating. In a preferred embodiment of this invention, the first and second organic coatings are removable by contact with an aqueous solution where one of said organic coatings is soluble in aqueous acid solution and the other is soluble in aqueous base solution.

Suitable electrophoretic coating compositions suitable for purposes of the second organic coating compositions are those disclosed in U.S. Pat. No. 4,592,816 incorporated herein by reference. These compositions comprise aqueous solutions or emulsions of at least one polymer containing a carrier group, optionally a photoinitiator and a source of unsaturation for a crosslinking reaction if the composition is to be used as a photoresist. The source of unsaturation is preferably a monomer.

The polymer component of the composition contains carrier groups that become positively or negatively charged upon contact with either an acid or a base, dependent upon the specific carrier group employed. The carrier group is one selected so that a deposited film will be developable with an aqueous acid or aqueous base solution. Suitable polymers are addition and condensation polymers having the aforesaid carrier groups. Addition polymers having carrier groups prepared from monomers having ethylenic unsaturation are preferred. Polymers containing carrier groups that are useful in the photosensitive polymer composition include acrylic polymers, vinyl polymers other than acrylic polymers, epoxy polymers, polyurethanes, polyesters, and polyamides.

Polymers having positively charged carrier groups—i.e., cataphoretic carrier groups, will deposit on a negatively charged electrode. Such carrier groups include, for example, quaternary ammonium groups, sulfonium groups and sulfoxonium groups. Other groups which become positively charged upon reaction with an acid, such as for example amine groups, may also be employed. The acids that are useful to protonate the carrier groups of the polymers include lactic acid, glycolic acid, hydroxyacetic acid, hydrochloric acid, formic acid, acetic acid and phosphoric acid.

Polymers having negatively charged carrier groups—i.e., anaphoretic carrier groups, will deposit on a positively charged electrode. Carboxylic acid groups are suitable negatively charged carrier groups.

For photoactive coatings, the preferred compositions suitable for electrophoretic deposition are formed by mixing the polymer containing carrier groups with at least one unsaturated monomer and a photoinitiator so that a polymer film electrophoretically deposited on a surface is capable of being polymerized into a cross linked polymer when exposed to actinic radiation. Unsaturated monomers having two or more unsaturated groups attached to the same molecule are preferred. Most preferred are the multifunctional monomers having two or more acrylates or methacrylate groups attached to each monomer molecule. Examples of suitable monomers are set forth in the above referenced patent. Examples of photoinitiators suitable for use in the polymeric composition include the azo compounds, sulfur-containing compounds, metallic salts and complexes, oxines, amines, polynuclear compounds, organic carbonyl compounds, various quinones, etc. Specific examples of suitable photoinitiators are also set forth in U.S. Pat. No. 4,592,816.

Example 1 of U.S. Pat. No. 4,592,816 is a most preferred electrophoretically depositing composition for purposes of the invention.

As would be obvious to those skilled in the art, the compositions may also contain other additives such as wetting agents, plasticizers, coalescing agents, levelling agents, etc.

Continuing with the process sequence, the next step in the process involves removal of the first organic coating layer, layer 3 of FIG. 1 without degrading organic coating layer 4. This is accomplished by contact of the coated surface with a solvent or stripper for the first organic coating layer which solvent is not a solvent or stripper for the second organic coating. Using the preferred coating materials described above, both organic coating layer 3 and layer 4 are soluble in a mild aqueous acid or base solution provided both are not soluble in the same solvent. Following contact of the article with a solvent or stripper for organic coating layer 3, the composite would have the structure shown in Step C of FIG. 1 comprising substrate 1, copper cladding 2, and organic coating layer 4.

The next step in the process comprises the permanent alteration of the surface bared by removal of the first organic coating layer. Permanent alteration of the surface can comprise addition of a substance to the surface or removal of a portion or all of the surface. Addition to the surface can be by deposition of metal onto the surface. Removal of the surface can be by etching. A procedure involving deposition would result in the structure depicted in Step D of FIG. 1 where layer 5 illustrates a deposited material such as a metal. Etching of the surface would result in the structure depicted in Step E of FIG. 1 where the underlaying surface 2 bared by removal of the first organic layer 3 has been removed by contact with an etchant.

It should be noted that an intermediate article formed in the process of the invention is similar to an intermediate article formed using a photoresist alone. With a photoresist, a surface is coated with the photoresist and following exposure to activating radiation, the coating has areas of differing solubility. Thus the exposed photoresist coating is an organic coating with discrete areas of differing solubility. This is similar to the coating formed by the process of the subject invention as depicted in Step B of FIG. 1. However, the organic coating of the subject invention is formed subsequently to the development of an exposed photoresist layer and provides a coating having greater flexibility than an organic coating comprising an exposed and undeveloped photoresist. Using the coating of the invention, a process may be devised where the electrophoretically deposited coating is able to withstand aggressive chemical environments that a photoresist would be unable to withstand. For example, using the preferred coating compositions described above, the negative acting photoresist would be unable to withstand high temperature alkaline solutions such as the solutions used for immersion plating of gold. The preferred electrophoretically deposited coatings would be able to withstand such solutions.

The process described herein has many industrial applications. Many of these applications find use in the formation of printed circuit boards. One such process involves elimination of the requirement for a dissimilar metal etch resist in a subtractive method for the manufacture of printed circuit boards. Another process involves simplification of the tab or finger plating process in circuit board manufacture. Both of these processes are illustrated below.

Figure 2:
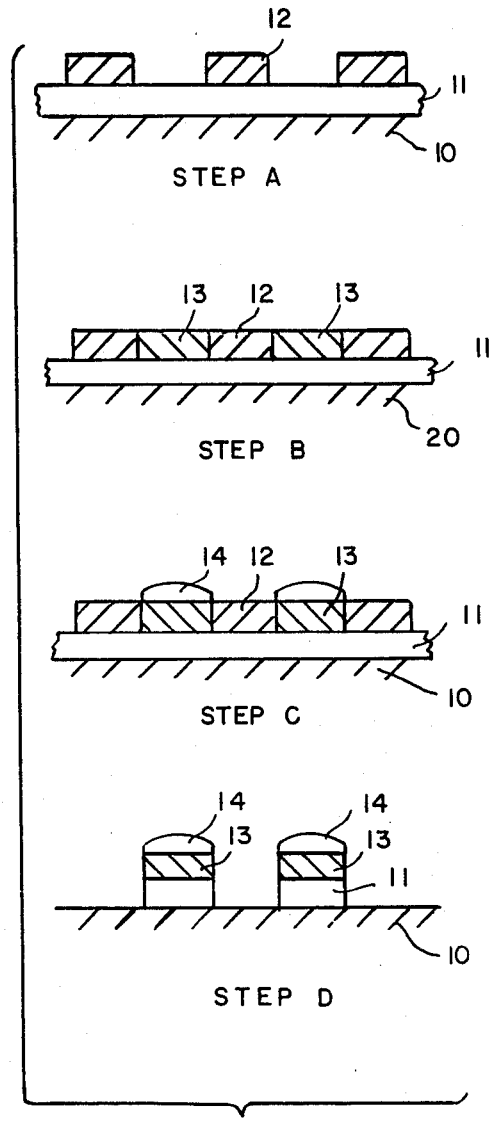
FIG. 2 represents a printed circuit board formed by a subtractive process as it would appear at different stages in its manufacture in accordance with one embodiment of the invention.

A process for making a printed circuit board using an electrophoretically deposited coating as an etch resist in place of a dissimilar metal is described above and illustrated in FIG. 2 of the drawings where all parts are in exaggerated dimension for ease of presentation. Briefly stated, Step A of FIG. 2 shows a printed circuit board base material comprising a dielectric substrate 10 and copper cladding 11. The board may have plated through-holes (not shown in the drawing) if desired. A photoresist coating is applied over the circuit board base material, imaged and developed to yield relief image 12. As shown in Step B of FIG. 2, electroplated copper 13 is deposited over copper not coated with relief image 12. As shown, the copper is deposited in a thickness equivalent to the height of relief image 12. This is not a requirement of the process. The next step in the process, illustrated as Step C of FIG. 2, comprises electrophoretic deposition of the second organic coating 14 over electroplated copper 13. Organic coating 14 will deposit only over a conductive surface and therefore deposits in a negative image of organic coating 12. In the illustration given, organic coatings 12 and 14 form a single layer which is non-planar i.e., of differing heights. The final steps of the process are shown by Step D of FIG. 2. These steps involve preferential removal of organic coating 12 and etching or bared copper layer 11 to provide an article comprising substrate 10 having conductor lines comprising cladding layer 11 reinforced with electrolytic copper layer 13 protected by the electrophoretically deposited coating layer 14.

A process substituting an electrophoretically deposited organic coating as an etch resist for an electroplated dissimilar metal etch resist such as solder is an improvement in the art. Electroplating solder to full thickness sufficient to act as an etch resist is time consuming and lowers the through put in the manufacture of printed circuit boards. The process of stripping the solder from the board is time consuming, involves etchants that are difficult to handle and leaves a waste solution which requires expensive waste treatment procedures for disposal.

A process for manufacture of a printed circuit board substituting an electrophoretically deposited organic coating for electrolytic deposited dissimilar metal is more specifically described in the following Example which represents the most preferred embodiment of the invention.

EXAMPLE 1

In this example, a circuit board material was used that was received with plated through holes, an imaged and developed negative dry film coating and an electroplated copper deposit over the copper bared by development of the negative dry film. The procedures for forming a circuit board base material of this nature are known in the art and do not, by themselves, constitute a part of this invention. Therefore, Steps 1 through 4 that follow are hypothetical and are intended to illustrate a manner in which the circuit board base material may be prepared.

Step 1: Prepare a printed circuit board base material for further processing.

The circuit board base material used is an FR-4 laminate coated on both sides with copper. The board could be prepared by a sequence of steps including drilling through holes at appropriate locations, cleaning the copper for further processing, catalyzing the board with a tin-palladium colloid such as the catalyst sold under the tradename Cataposit 44 by Shipley Company Inc. of Newton, Mass. and electroplating copper onto the walls of the through holes and onto the copper cladding. An electroless copper plating solution such as that sold under the tradename CP-78, also available from Shipley Company Inc., would be suitable for the deposition step. Times of immersion and conditions would be in accordance with the instructions supplied by the manufacturer of the materials used.

Step 2: Apply photoresist film to circuit board base material with plated through holes.

A negative dry film photoresist would be applied to the circuit board base material prepared in accordance with the procedure of Step 1. The film used would preferably be one sold under the trademark Riston, a negative acting dry film available from E. I. Dupont de Nemours and Co. of Wilmington, Del. Heat and pressure would be used to apply the film to the board. Conditions for application of the film would be in accordance with instructions from the manufacturer of the film.

Step 3: Expose and develop photoresist.

The board coated with the negative dry film would be exposed through a master in a desired image pattern to a source of activating radiation and developed with either a weak carbonate solution or a commercial developer available for the Riston dry film resists. Exposure and development would be in accordance with instructions from the manufacturer of the film.

Step 4: Electroplate copper.

Following development of the dry film, the electroless copper deposit would be reinforced by a deposit of electrolytic copper. A suitable electrolytic copper depositing solution would be Electroposit 892 available from Shipley Company Inc. Conditions such as current density, deposition temperature, etc. would be in accordance with instructions from Shipley Company Inc.

Step 5: Electrophoretically deposit organic coating over copper.

The electrophoretic depositing composition used was as follows:

| | |
|---|---|
| Polymer | 132.0 grams |
| Dimethylamino ethyl methacrylate (8 parts) | |
| Methyl methacrylate (68 parts) | |
| Butyl acrylate (23 parts) | |
| Vinyl acetate (1 part) | |
| Trimethylolpropane triacrylate | 46.0 grams |
| Dye* | 1.6 grams |
| Acetone | 12.0 grams |
| Lactic acid (20%) | 24.0 grams |
| Distilled water | to 1000.0 grams |

*Orasol Blue 2GLN available from Ciba Geigy Chemical Company.

A portion of the above composition was added to a 250 ml. beaker used as a plating cell. A 1"×2" Monel screen was used as the anode and the circuit board base material was used as the cathode. The anode to cathode space was 2 inches. Bath temperature was maintained at 22° C. A voltage of 60 volts was applied across the electrodes and the voltage was applied for 10 seconds which was sufficient to deposit the electrophoretic coating over the copper electroplate.

Step 6: Strip photoresist from circuit board base material.

The Riston photoresist was removed by immersion of the circuit board base material in a 2% solution of potassium hydroxide maintained at 60° C. for 60 seconds.

Step 7: Etch exposed copper.

Copper bared by removal of the photoresist film was removed by etching with a cupric chloride etchant for a time sufficient to remove all exposed copper.

Step 8: Remove electrophoretic coating.

The electrophoretic coating was removed by immersion in a 5% lactic acid solution until all of the coating was removed.

Examination of the part formed by the process of example 1 showed a circuit image of good line resolution. The copper comprising the circuit was unaffected by the cupric chloride etchant indicating that the electrophoretically deposited coating served to protect the copper from the etchant.

In the above process, the electrophoretically deposited coating need not be a photosensitive coating. However, as disclosed in the publications described above, it is known in the art to deposit electrophoretic coatings that are light sensitive photoresist compositions. The use of electrophoretically deposited photoresists in the process of the invention would permit additional commercial uses. For example, an electrophoretically deposited photoresist could find application in the above process for manufacture of circuit boards where prior to the step of removal of the dry film photoresist, the remaining electrophoretically applied resist could be blanket exposed to cure the same. This exposure would result in the coating providing even better resistance to aggressive environments than the uncured coating.

Another application for a photoactive electrophoretic coating, again for the manufacture of printed circuit boards would be for tab plating. In use of a printed circuit, a connector is attached to the circuit by sliding the connector onto conductive tabs located on the edge of the circuit board. These tabs must be hard and oxidation resistant. To obtain hardness and oxidation resistance, the tabs are conventionally plated first with electroplated nickel and then with electroplated gold. In a conventional process for forming a board using a dissimilar etch resist as described above, following the step of etching copper, platers tape would be placed directly above the tabs to isolate the tabs from the balance of the board. Solder would then be stripped from the tabs and the tabs plated first with nickel and then with gold. This process can be greatly simplified using an electrophoretically deposited light sensitive coating of the type described above. The electrophoretically deposited coating would be imaged in a band above the tabs to cure the same. The remainder of the coating would then be removed by development to expose the tabs for plating. The process would avoid the need for platers tape. The following example illustrates such a process and represents an additional preferred embodiment of the invention.

EXAMPLE 2

In this example, tab plating was not actually performed and the method of tab plating would be in accordance with prior art procedures.

Steps 1 through 4 same as Example 1.

Step 5: Electrophoretically deposit light sensitive organic coating over copper.

The procedure of Step 5 from example 1 is repeated, but a photoinitiator is added to the formulation of the electrophoretic coating composition. The photoinitiator used is Darocur 1664, a mixture of arylic ketones commercially available from Merck Chemical Company. The photoinitiator is used in an amount of 4.0 grams per 1000 grams of the formulation.

Steps 6 and 7—same as Example 1.

Step 8: Expose and develop electrophoretically deposited photoresist.

The electrophoretically deposited photoresist is exposed through a master in the form of a band above the areas of the tabs. The method of exposure comprises exposure to a mercury light source at an exposure energy of 200 mJ/cm$^2$. Development is by immersion in 5% aqueous solution of lactic acid at 25° C. for 60 seconds.

Step 9: Electroplate nickel and rinse.

Step 10: Electroplate gold and rinse.

Step 11: Remove electrophoretic photoresist by immersion in a 25% aqueous solution of lactic acid at 55° C. for 60 seconds.

The invention will find application beyond that disclosed in the above description.

We claim:

1. A process for altering a metal surface comprising the steps of electrophoretically applying a first organic photoresist coating over said surface and exposing and developing the same to yield a relief image pattern whereby a part of the surface is coated with said first organic coating and a part of the surface is not coated with said first organic coating, electrophoretically depositing a second organic coating over uncoated areas of the surface, said first and second organic coating being soluble in different solvents, dissolving the first organic coating in a solvent that is not a solvent for the second organic coating, thereby exposing the underlying surface in an image pattern, and permanently altering the exposed underlying surface.

2. The process of claim 1 where the first and second coatings are soluble in aqueous solutions and each coating is insoluble in an aqueous solution in which the other coating is soluble.

3. The process of claim 2 where one coating is soluble in an aqueous acid solution and the other is soluble in an aqueous alkaline solution.

4. The process of claim 2 where the first organic coating is soluble in an aqueous alkaline solution and the second organic coating is soluble in an aqueous acid solution.

5. The process of claim 1 where the substrate is altered by etching.

6. The process of claim 1 where the substrate is altered by a metal plating process.

7. A process for forming a printed circuit board from a circuit board base material having a copper surface comprising the steps of applying a first organic coating over the copper surface of the base material in a relief image pattern whereby a part of the copper surface is coated with said first organic coating and a part of the copper surface is not coated with said first organic coating, electrophoretically depositing copper over the copper surface not coated with the first organic coating, electrophoretically depositing a second organic coating over uncoated areas of the copper surface, said first and second organic coatings being soluble in different solvents, dissolving the first organic coating in a solvent that is not a solvent for the second organic coating thereby exposing the underlying copper in an image pattern, removing the exposed underlying copper and removing the electrophoretically deposited organic coating.

8. The process of claim 7 where the first organic coating is a photoresist that is exposed and developed to yield a relief image.

9. The process of claim 8 where the photoresist is a negatively acting dry film resist.

10. The process of claim 8 where the photoresist is electrophoretically deposited over the conductive substrate.

11. The process of claim 8 where one coating is soluble in an aqueous acid solution and the other is soluble in an aqueous alkaline solution.

12. The process of claim 8 where the first organic coating is soluble in an aqueous alkaline solution and the second organic coating is soluble in an aqueous acid solution.

13. The process of claim 8 where the second organic coating is not photo imageable.

14. The process of claim 8 where the second organic coating is a photoresist.

* * * * *